United States Patent [19]

Wang

[11] Patent Number: 5,471,142
[45] Date of Patent: Nov. 28, 1995

[54] CIRCULARLY POLARIZED LOCAL ANTENNA ARRANGEMENT FOR A NUCLEAR MAGNETIC RESONANCE TOMOGRAPHY APPARATUS AND METHOD FOR OPERATING SAME

[75] Inventor: Jianmin Wang, Erlangen, Germany

[73] Assignee: Siemens Aktiengesellschaft, Munich, Germany

[21] Appl. No.: 125,804

[22] Filed: Sep. 24, 1993

[30] Foreign Application Priority Data

Sep. 30, 1992 [DE] Germany .......................... 42 32 827.6

[51] Int. Cl.⁶ .................................................. G01R 33/28
[52] U.S. Cl. ........................................... 324/318; 324/322
[58] Field of Search ................................. 324/318, 322, 324/314, 300; 128/653.5

[56] References Cited

U.S. PATENT DOCUMENTS

| | | | |
|---|---|---|---|
| 4,467,282 | 8/1984 | Siebold | 324/309 |
| 4,816,765 | 3/1989 | Boskamp | 324/318 |
| 4,825,162 | 4/1989 | Roemer et al. | 324/318 |
| 4,906,933 | 3/1990 | Keren | 324/318 |
| 4,975,644 | 12/1990 | Fox | 324/318 |
| 5,160,891 | 11/1992 | Keren | 324/318 |
| 5,196,796 | 3/1993 | Misic | 324/322 |
| 5,198,768 | 3/1993 | Keren | 324/318 |
| 5,241,272 | 8/1993 | Friedrich | 324/318 |
| 5,258,717 | 11/1993 | Misic | 324/318 |

FOREIGN PATENT DOCUMENTS

| | | |
|---|---|---|
| 0133364 | 2/1985 | European Pat. Off. . |
| 0338624 | 10/1989 | European Pat. Off. . |
| 0472390 | 2/1992 | European Pat. Off. . |
| 4024598 | 2/1991 | Germany . |
| 9115503 U | 5/1992 | Germany . |
| 2221096 | 1/1990 | United Kingdom . |
| WO89/05115 | 6/1989 | WIPO . |

Primary Examiner—Sandra L. O'Shea
Assistant Examiner—Raymond Y. Mah
Attorney, Agent, or Firm—Hill, Steadman & Simpson

[57] ABSTRACT

An antenna arrangement for a magnetic resonance imaging apparatus is composed of an array having at least three linearly polarized local coils which mutually overlap to such an extent that they are geometrically decoupled. Each local coil is separately connected to a combination network wherein a complex operation between the output signals of the respective local coils is produced such that a radio-frequency signal corresponding to a circular polarization is obtained.

6 Claims, 4 Drawing Sheets

CIRCULARLY POLARIZED LOCAL ANTENNA ARRANGEMENT FOR A NUCLEAR MAGNETIC RESONANCE TOMOGRAPHY APPARATUS AND METHOD FOR OPERATING SAME

BACKGROUND OF THE INVENTION

1. Field of the Invention

The present invention is directed to a circularly polarized antenna arrangement for use as a local antenna arrangement in a nuclear magnetic resonance tomography apparatus, and to a method for operating such a local coil arrangement.

2. Description of the Prior Art

The signal-to-noise ratio in MR imaging can be noticeably improved with circularly polarized antennas compared to linearly polarized antennas, given the same exposure time. Circularly polarized whole-body antennas can be realized in a simple way by arranging two sub-antennas offset by 90° at the circumference of a cylindrical examination space.

U.S. Pat. No. 4,816,765 shows a local coil having a flat structure that likewise generates a circularly polarized field. A so-called butterfly coil arrangement is used to generate one field component lying parallel to the local coil in the examination region. A field component is also generated perpendicular to the surface of the surface coil by a further coil lying in the middle of the butterfly arrangement.

Antenna arrays, i.e. a chain of a plurality of sub-antennas, are often employed, for example for examining the spinal column or for the examination of transversal body layers. Such an array is disclosed for example, in PCT application WO 89/05115. This array, however, is linearly polarized and thus has a correspondingly poorer signal-to-noise ratio.

Due to the coupling between the individual coils that arises, the circularly polarized surface coil disclosed by the aforementioned U.S. Pat. No. 4,816,765 is not suitable for arrays that extend transversely relative to the basic magnetic field.

SUMMARY OF THE INVENTION

It is an object of the present invention to specify a structure for a circularly polarized local antenna, whereby an unproblematical decoupling between the individual elements is possible in arrays that extend transversely relative to the basic magnetic field.

This object is inventively achieved in a local antenna arrangement composed of an array of at least three linearly polarized local coils that mutually overlap to such an extent that they are geometrically decoupled, wherein each local coil is separately connected to a combination network which produces a complex operation between the output signals of the three local coils, such that a radio-frequency signal that corresponds to a circular polarization is obtained.

DESCRIPTION OF THE PREFERRED EMBODIMENTS

Figure 1:
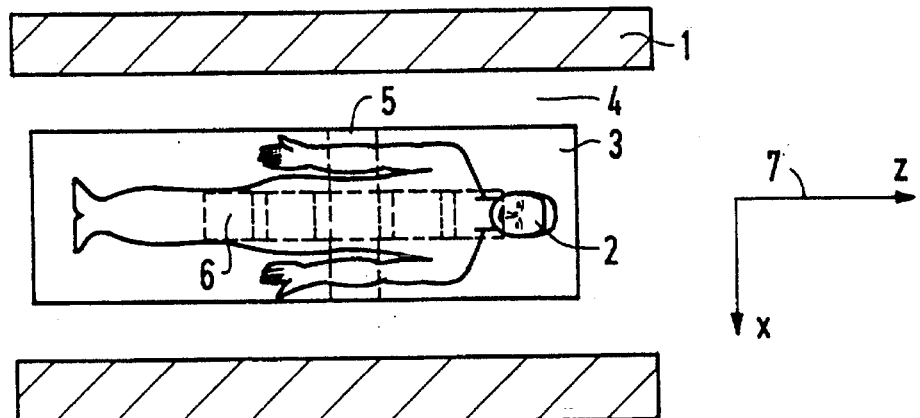
FIG. 1 shows a patient in a schematically illustrated horizontal section of a nuclear magnetic resonance tomography apparatus.

FIG. 1 schematically shows the arrangement of local coils in a horizontal section of a nuclear magnetic resonance tomography apparatus 1. Antenna arrangements referred to as local antennas are antennas that, by contrast to whole-body antennas, only cover a part of the examination space. Since coils are utilized in the present instance for such local antennas, the term "local coils" shall be used below.

In systems having super-conductive magnets, the patient 2 generally lies on a bed 3 within a tubular examination space 4. Every nuclear magnetic tomography also includes a whole-body antenna as well as gradient coils which, however, are not shown in FIG. 1 since the invention is exclusively directed to local coils. Cartesian coordinate axes 7 are shown in FIG. 1 which define the direction of the basic magnetic field (i.e., the longitudinal direction of the examination space ) as the z-direction. The x-direction lies perpendicularly thereto in the plane of the drawing and the y-direction lies perpendicularly to the plane of the drawing. These definitions are retained below.

FIG. 1 shows two coil arrays 5 and 6 having local coils. For imaging the spinal column, it is expedient to apply a coil array that extends in the longitudinal direction of the patient (i.e., in z-direction) on the surface of the patient. The signal-to-noise ratio of the received signals is all the better the closer the coils are to the examination subject (i.e., for example, the spinal column). Longitudinal sections through the patient 2 can be portrayed with the coil array 6. In order to be able to portray a complete transversal section through the patient 2 as well, a coil array extending transversely relative to the patient 2 (i.e., in the x-direction according to the coordinate axes 7) is required. It can be expedient to attach one such array respectively below and above the patient 2.

Figure 4:
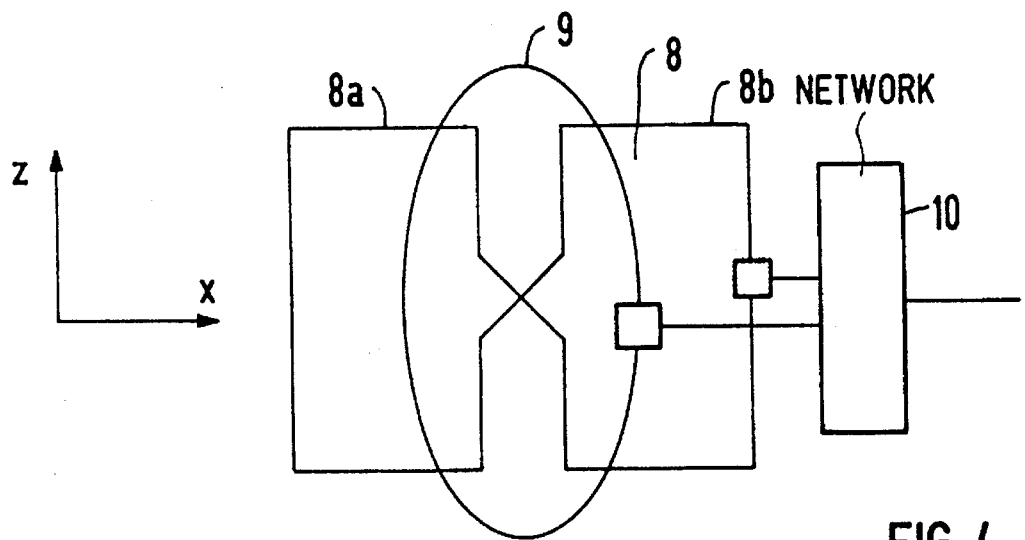
FIG. 4 shows a local antenna having circular polarization, of a known type.

The aforementioned U.S. Pat. No. 4,816,765 discloses circularly polarized local coils that have the advantage of a better signal-to-noise ratio when compared to linearly polarized local coils. FIG. 4 shows an example of such a coil. The coil is composed of two sub-coils, one of which is referred to as a butterfly coil 8, and a sub-coil 9 arranged in the middle of the butterfly coil 8, symmetrically relative thereto. The butterfly coil 8 has two halves 8a and 8b that are cross-connected in series, so that the magnetic field lines of the coil halves 8a and 8b have opposite directions. The two sub-coils 8 and 9 are each connected to a network 10 such that a circular polarization arises.

Figure 5:
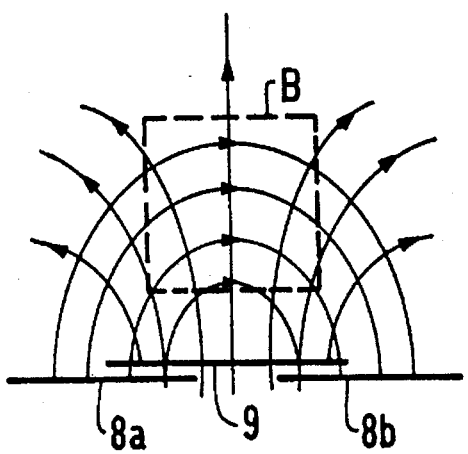
FIG. 5 shows the magnetic field lines of the known arrangement of FIG. 4.

FIG. 5 shows how the field components residing perpendicularly relative to one another, which are required for the circular polarization, are obtained in an examination region B with the local coil arrangement of FIG. 4. The field lines of the butterfly coil 8 proceed from the sUb-coil 8a to the sub-coil 8b, and thus essentially parallel to the plane of the local coil in the examination region B. The field lines of the sub-coil 9, by contrast, proceed essentially perpendicularly to the plane of the local coil in the examination region B. The field lines of the butterfly coil 8 in the examination region B are thus substantially perpendicular to the field lines of the sub-coil 9, so that the field components residing perpendicularly relative to one another which are required for the circular polarization are obtained. The sub-coil 9 supplies the vertical component and the butterfly coil 8 supplies the horizontal component. The sub-coil 9 shall therefore also be referred to below as the vertical coil and the butterfly coil 8 shall be referred to as the horizontal coil.

As shown in FIG. 4, the local coil arrangement must be arranged such that the polarization plane lies perpendicular to the z-direction, i.e. perpendicular to the direction of the basic magnetic field.

The coil arrangement of FIG. 4 in fact yields an improvement of the signal-to-noise ratio in comparison to conventional, linearly polarized arrangements; however, it can only be conditionally utilized for local coil arrays. Such arrays are composed of an arrangement of individual local coils whose signals are read out in parallel and are compiled to form an image. The signal-to-noise ratio obtainable with local coil arrays corresponds to the signal-to-noise ratio of an individual coil. The imaging region is limited by the total number of individual coils.

A high degree of decoupling of the individual coils is desirable in such arrays. An incomplete decoupling makes the matching of the individual coils considerably more difficult, leads to a correlation of the noise parts of the individual coils, and thus to a substantial decrease in the achievable signal-to-noise ratio.

An adequate decoupling given linearly polarized coils is achieved by partial overlap of the individual coils—this is therefore referred to as "geometrical decoupling".

Figure 2:
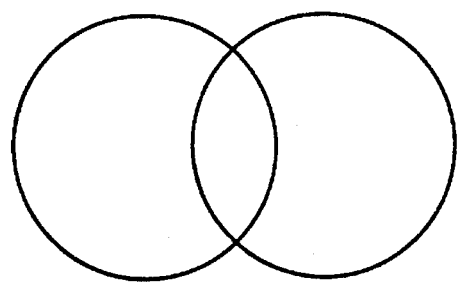
FIG. 2 shows an array having two overlapping coils.
Figure 3:
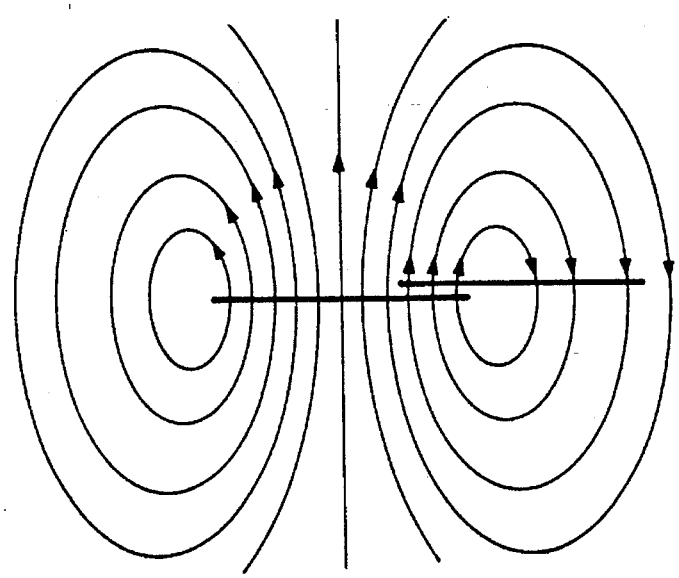
FIG. 3 shows the field line course through the coil of FIG. 2.

The principle of geometrical decoupling shall be set forth below with reference to FIGS. 2 and 3. For simplicity, two circular, overlapping coils according to FIG. 3 form the basis of the discussion. FIG. 3 shows the course of the magnetic field lines emanating from the left coils in a side view. It can be seen that the field lines permeating the right coil in the overlapped region have a direction opposite to that outside the overlapped region. By an appropriate dimensioning of the overlap, the magnetic flux in the overlapped region can be made to be exactly the same size as outside the overlapped region. Since, however, the flux directions are opposed, the effect of the magnetic field emanating from the left coil is cancelled in the right coil. The same is also true for the magnetic field emanating from the right coil. This condition is referred to as geometrical decoupling.

Figure 6:
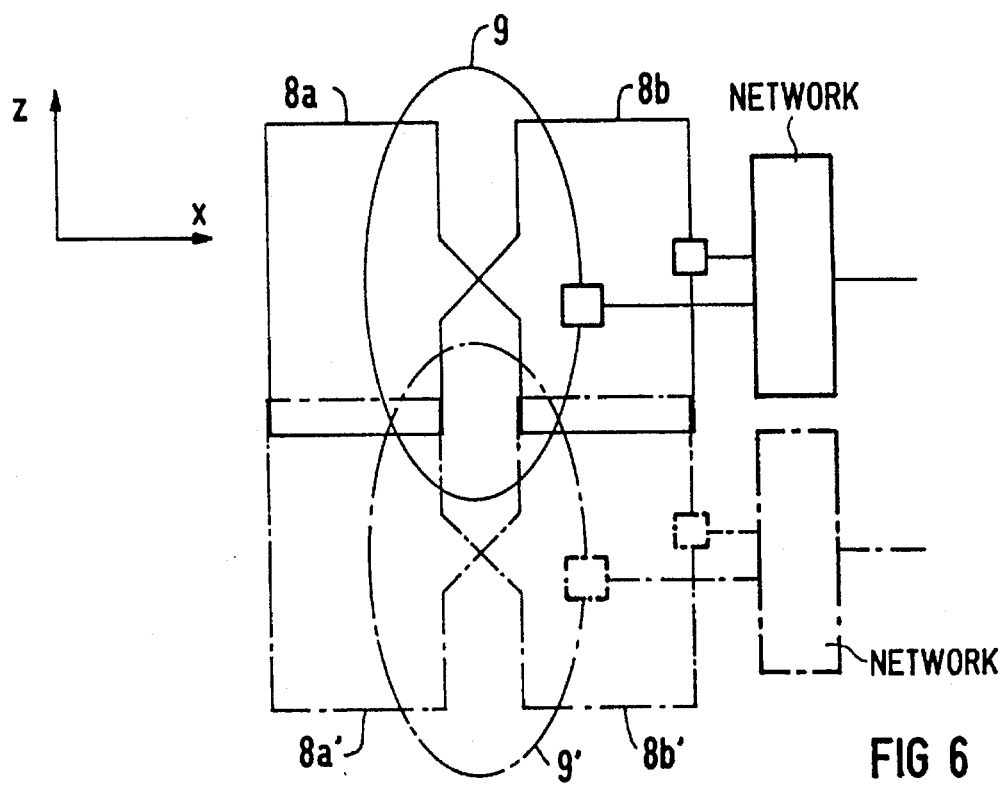
FIG. 6 shows an array of local antennas having circular polarization and extending in the z-direction.
Figure 7:
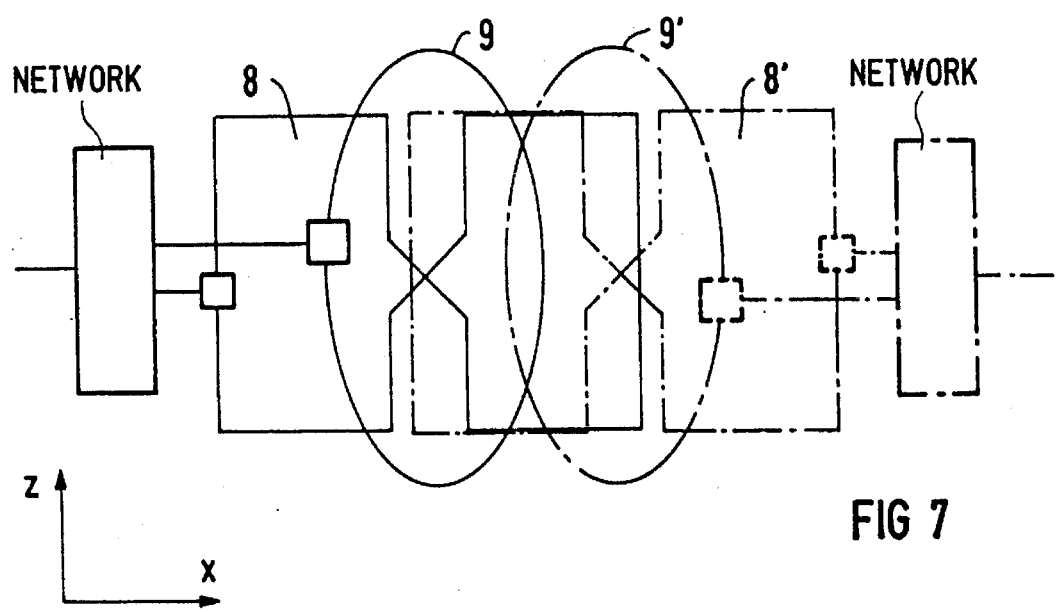
FIG. 7 shows an array of local coils having circular polarization and extending in the x-direction.

A geometrical decoupling given an appropriate dimensioning is in fact also possible given an array of a plurality of circularly polarized local coils according to FIG. 4, as long as the array extends in the direction of the basic magnetic field, i.e. in the z-direction. FIG. 6 shows an array having two circularly polarized local coils. When the overlap between the sub-coils 9 and 9', 8a and 8a', 8b and 8b' is correspondingly dimensioned, a geometrical decoupling can be achieved between the sub-coils in each of the aforementioned pairs. Given a circularly polarized array that extends in the x-direction, the circularly polarized local coils would have to be arranged as shown in FIG. 7, since the polarization plane must lie perpendicular to the direction of the basic magnetic field, i.e. to the z-direction. One could thereby in fact decouple the vertical coils 9 and 9a from one another. A simultaneous geometrical decoupling of the horizontal coils 8 and 8' from one another as well as a mutual geometrical decoupling between the vertical and horizontal coils, however, are not possible. Decoupling circuits, for example with transformers, likewise do not lead to usable results.

Figure 8:
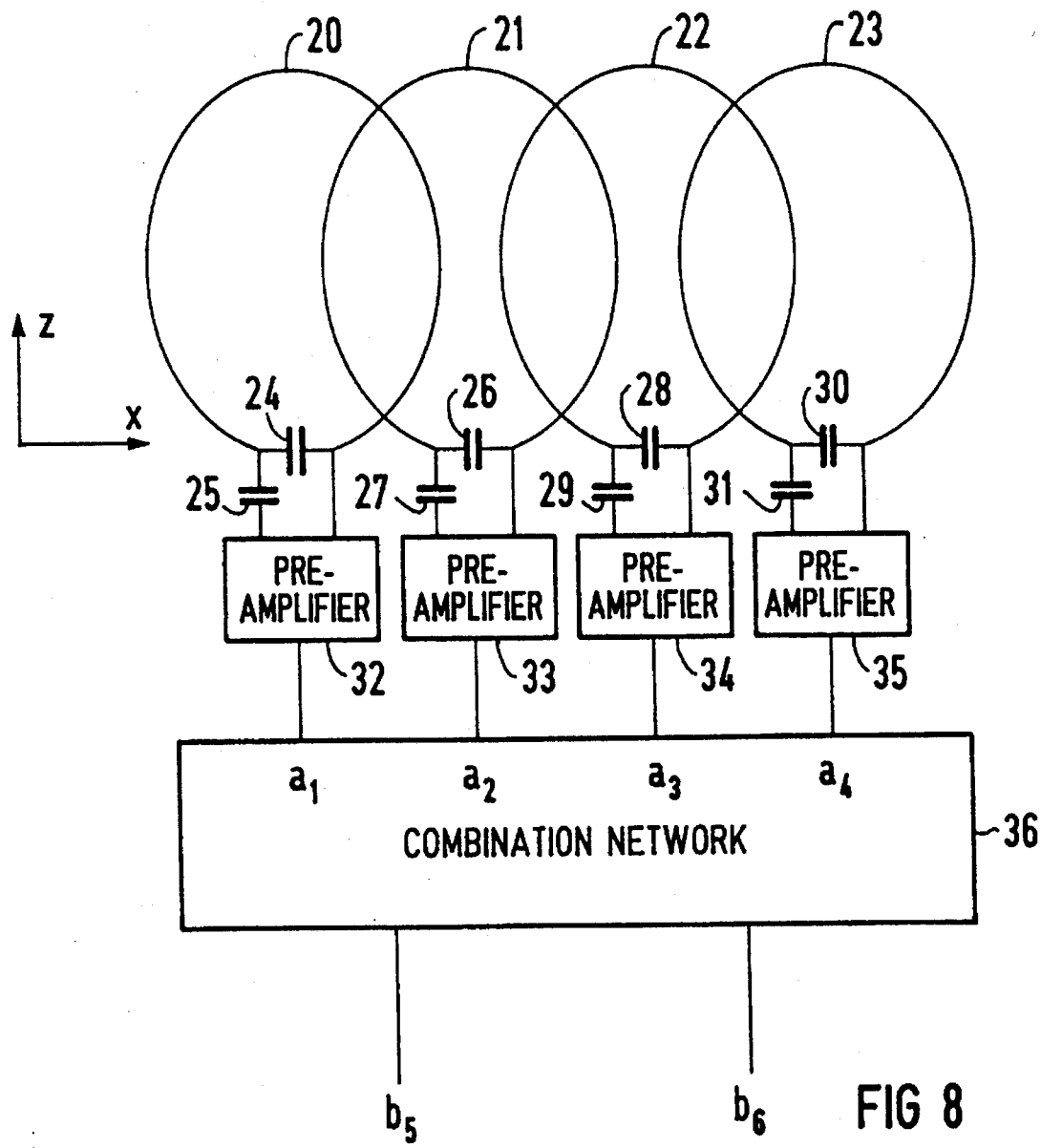
FIG. 8 shows an exemplary embodiment of an antenna arrangement constructed and operating in accordance with the principles of the present invention.

A geometrical decoupling for an array that extends in a direction perpendicular to the magnetic field, i.e. in the x-direction or the y-direction, however, can be achieved with the exemplary embodiment of the invention shown in FIG. 8. The array is composed of four identical local coils 20 through 23 arranged side-by-side in the x-direction with the same spacing, each local coil 20 through 23 being linearly polarized when considered by itself. Local coils 20 through 23 are respectively connected to a pre-amplifiers 32 through 35 via a matching network. Each matching network is composed of a parallel capacitor (capacitors 24 through 30) and a series capacitor (capacitors 25 through 31). The output signals $a_1$ through $a_4$ of the pre-amplifiers 32 through 35 are supplied into a combination network 36. Two circularly polarized signals $b_5$ and $b_6$ are taken at the output of the combination network 36.

The following, complex operations between the input signals and output signals are produced in the combination network 36:

$$b_5 = S_{51}a_1 + S_{52}a_2 + S_{53}a_3$$

$$b_6 = S_{62}a_2 + S_{63}a_3 + S_{64}a_4$$

The complex coefficients $S_{51}$ through $S_{53}$ and $S_{62}$ through $S_{64}$ in the ideal case are:

$$S_{51} = \frac{\sqrt{2}}{2}$$

$$S_{52} = e^{j\pi/2}$$

$$S_{53} = -\frac{\sqrt{2}}{2}$$

$$S_{62} = \frac{\sqrt{2}}{2}$$

$$S_{63} = e^{j\pi/2}$$

$$S_{64} = -\frac{\sqrt{2}}{2}$$

The difference between the signals $a_1$ and $a_3$, or $a_2$ and $a_4$, proceeding to the combination network 36 corresponds to the output signals of two horizontally polarized coils that overlap in the x-direction. The circular polarization of the group of three local coils 20 through 22 is achieved by the addition of the signals $a_2$ and $a_3$ that are phase-shifted by 90°. The group of three coils 20 through 22 thus represents a circularly polarized local coil in the final analysis which supplies the signals $b_5$. The local coils 21 through 23 are in turn combined to form a second group that supplies a second circularly polarized signal $b_6$ in a way analogous to that of the first group of local coils 20 through 22. Two circularly polarized local coils that are spatially offset in the x-direction are thus formed in a plane perpendicular to the z-direction from the local coils 20 through 23 arranged in series. The local coils 21 and 22 supply simultaneous horizontal and vertical sub-signals in neighboring array elements.

The principle can also be applied for a greater plurality of individual coils. In general, n+2 linearly polarized local coils are needed for realizing an n-channel, circularly polarized array, with all of the local coils, except the two extreme edge coils, contributing to move than one of the respective n-channel signals.

The value of the coefficients $S_{51}$ through $S_{53}$ and $S_{62}$ through $S_{64}$ is obtained by a normalization of the horizontally and vertically polarized signal components to the same noise power. As a rule, the signal-to-noise ratio of the vertical signal component is somewhat higher than the signal-to-noise ratio of the horizontal component. The coefficients are diminished corresponding to the different noise powers for an optimum combination.

The calculation of the circular output signals $b_5$ and $b_6$ from the signals $a_1$ through $a_4$ of the linearly polarized individual coils 20 through 23 according to the above-recited equation can ensue either by means of hardware or software. Given a hardware realization of the combination network 36, two computer input channels would be required for the signals $b_5$ and $b_6$; given a software operation of the signals $a_1$ through $a_4$, by contrast, four computer input channels are required. Since these input channels are relatively expensive, the software solution is recommendable for cost reasons, particularly for a greater number of sub-coils since the relative saving in terms of computer input channels then becomes correspondingly lower.

In a software solution, the aforementioned operation coefficients can be optimized dependent on the respective picture element, but they are permanently set given a hardware solution.

The arrangement shown in FIG. 8 has the advantage that the local coils 20 through 23 can be decoupled well by partial overlap as in the case of conventional, linearly polarized arrays.

Although other modifications and changes may be suggested by those skilled in the art, it is the intention of the inventors to embody within the patent warranted hereon all changes and modifications as reasonably and properly come within the scope of the inventor's contribution to the art.

I claim as my invention:

1. A circularly polarized local antenna arrangement for a nuclear magnetic resonance tomography apparatus, said antenna arrangement comprising:

an array of at least three local coils which are individually linearly polarized, said local coils being disposed relative to each other to overlap for geometrically decoupling said local coils from each other, each local coil generating an output signal; and combination network means, supplied with said output signals from said local coils, for conducting a complex operation on said output signals for producing a radio-frequency signal corresponding to a circular polarization of said array.

2. A circularly polarized local antenna arrangement as claimed in claim 1, wherein each of said local coils in said array is identical to the other local coils and, wherein said local coils in said array are identically spaced relative to each other.

3. A circularly polarized local antenna arrangement for a nuclear resonance tomography apparatus, said antenna arrangement comprising:

an array consisting of 3+n local coils which are individually linearly polarized, said local coils being disposed relative to each other to overlap for geometrically decoupling said local coils from each other, each local coil generating an output signal; and combination network means, supplied with said output signals from said local coils, for operating on said output signals to produce (n+1) radio-frequency signals corresponding to a circular polarization of said array, said combination network means grouping said output signals for producing an $x^{th}$ radio-frequency signal from a group of said local coils x ... (x+2) and further radio-frequency signals are produces from respective groups of local coils (x+1) ... (x+3), with x having successive values between 1 and n+1, so that all of said local coils except two extreme edge local coils contribute to more than one of said radio-frequency signals.

4. A circularly polarized local antenna arrangement as claimed in claim 3, wherein each of said local coils in said array is identical to the other local coils and, wherein said local coils in said array are identically spaced relative to each other.

5. A method for operating an array composed of at least three linearly polarized local coils comprising the steps of:

overlapping said local coils for geometrically decoupling said local coils from each other;

obtaining an output signal from each of said local coils; and combining said output signals on said local coils using a complex operation for producing a radio-frequency signal corresponding to a circular polarization of said array.

6. A method as claimed in claim 5, wherein said array is composed of 3+n local coils, and wherein the step of combining said output signals is further defined by producing (n+1) radio-frequency signals by grouping said output signals of said local coils for producing an $x^{th}$ radio-frequency signal from a group of local coils x ... (x+2) and producing further radio-frequency signals from groups of local coils (x+1) ... (x+3), with x having successive values between 1 and n+1.

\* \* \* \* \*